United States Patent
Anderson et al.

(10) Patent No.: US 6,876,200 B2
(45) Date of Patent: Apr. 5, 2005

(54) NMR PROBE HAVING AN INNER QUADRATURE DETECTION COIL COMBINED WITH A SPIRAL WOUND OUTER COIL FOR IRRADIATION

(75) Inventors: Weston Anderson, Palo Alto, CA (US); Wai Ha Wong, San Jose, CA (US); James Finnigan, Santa Clara, CA (US)

(73) Assignee: Varian, Inc., Palo Alto, CA (US)

(*) Notice: Subject to any disclaimer, the term of this patent is extended or adjusted under 35 U.S.C. 154(b) by 124 days.

(21) Appl. No.: 10/403,064

(22) Filed: Mar. 31, 2003

(65) Prior Publication Data

US 2004/0189304 A1 Sep. 30, 2004

(51) Int. Cl.$^7$ ................................. G01V 3/00
(52) U.S. Cl. ...................... 324/318; 324/322
(58) Field of Search ................... 324/318, 319, 324/322; 600/410; 606/20

(56) References Cited

U.S. PATENT DOCUMENTS

| | | | | |
|---|---|---|---|---|
| 4,694,255 A | * | 9/1987 | Hayes | 324/318 |
| 5,433,717 A | * | 7/1995 | Rubinsky et al. | 606/20 |
| 5,594,342 A | * | 1/1997 | Brey et al. | 324/322 |
| 5,646,531 A | * | 7/1997 | Renz | 324/318 |
| 6,100,694 A | * | 8/2000 | Wong | 324/318 |
| 6,420,871 B1 | * | 7/2002 | Wong et al. | 324/318 |

OTHER PUBLICATIONS

Article by Chen et al., entitled "Quadrature Detection Coils–A Further Improvement in Sensitivity", published by Journal of Magnetic Resonance, vol. 54, pp. 324–327 (1983).

Article by Pimmel et al., entitled "A Hybrid Bird Cage Resonator for Solim Observation at 4.7.T", published by Magnetic Resonance in Medicine, vol. 24, pp. 158–162 (1992).

Article by Su et al., entitled "A New Miniaturizable Birdcage Resonator Design With Improved Electric–Field Characteristics", published by Journal of Magnetic Resonance, Series B 110, pp. 210–212 (1996).

Article by Crozier et al.,entitled "Optimized Small–Bore, High–Pass Resonator Designs", published by Journal of Magnetic Resonace, Series B109, pp. 1–11 (1995).

Article by Rath, Alan R., entitled "Design and Performance of a Double–Tuned Bird–Cage Coil", published by Journal of Magnetic Resonance, vol. 86, pp. 488–495 (1990).

Article by Wong, W.H. et al., entitled "5mm Birdcage Coils for Micro–Imaging Applications", Poster 171, 41st ENC, Apr. 2000.

* cited by examiner

Primary Examiner—Brij B. Shrivastav
(74) Attorney, Agent, or Firm—Bella Fishman

(57) ABSTRACT

A high resolution NMR probe having two or more resonators, an inner resonator which is closely coupled to a sample and is used to stimulate and receive a response from one nuclear species, and an outer resonator to induce transitions in another nuclear species, wherein the resonators may be provided with cooling capability and may be made of superconducting material, and wherein the inner resonator may be a saddle coil or a birdcage coil with capability of being tuned, and wherein the outer resonator may be one or more spiral wound saddle coil.

25 Claims, 14 Drawing Sheets

NMR PROBE HAVING AN INNER QUADRATURE DETECTION COIL COMBINED WITH A SPIRAL WOUND OUTER COIL FOR IRRADIATION

BACKGROUND OF THE INVENTION

1. Field of Invention

This invention relates to a nuclear magnetic resonance (NMR) probe and magnetic resonance imaging (MRI) utilizing radio frequency (RF) signals; and more particularly, to such a probe having an inner detection resonator combined with an outer resonator consisting of a spiral irradiation coil to thereby minimize the mutual inductance between the two resonators. Sensitivity is improved by means of an inner resonator consisting of a birdcage coil or dual saddle coils operated in the quadrature mode. Further sensitivity enhancement is obtained by cooling the resonators, or by fabricating one or more of the resonators from a superconductive material and operating in the superconducting temperature region.

2. Related Art

The following disclosures show related art:
1. U.S. Pat. No. 6,100,694, Aug. 8, 2000, W. H. Wong.
2. U.S. Pat. No. 6,420,871, Jul. 16, 2002, W. H. Wong, S. Uno, and W. Anderson.
3. U.S. Pat. No. 4,694,255, Sep. 15, 1987, C. E. Hayes
4. "Quadrature Detection Coils. A further √2 Improvement in Sensitivity", C. N. Chen, D. I. Hoult, V. J. Sank, J. Mgn. Reson. 54, 324–327 (1983).
5. "A Hybrid Birdcage Resonator for Sodium Observation at 4.7 T", P. Pimmel and A. Briguet, Mgn. Reson. Med. 24, 158 (1992).
6. "A New Miniaturizable Birdcage Resonator design with Improved Electric Field Characteristics", S. Su, and JJ. K. Sanders, J. Magn. Reson. Ser. B, 110, 210–212 (1996).
7. "Optimized Small Bore, High Pass Resonator Designs" S. Crozier, K. Luescher, L. K. Forbes, D. M. Doddrell, J. Magn. Reson. Ser. B. 109, 1–11 (1995).
8. "Design and Performance of a Double Tuned Birdcage Coil", A. Rath, J. Magn. Reson. 86, 488–495 (1990).
9. "5 mm Birdcage Coils for Micro-imaging Applications", Wong, J. Finnigan, and S. Sukumar, Poster 171, 41st ENC, April 2000.

High resolution NMR probes typically have an inner saddle coil for irradiation and detection of a first nuclear species, and a second larger saddle coil coaxial with the inner saddle coil for irradiation of one or more other nuclear species. The two saddle coils are oriented 900 with respect to each other to minimize coupling between the two coils.

Normally, only one outer coil is used as additional saddle coils would strongly couple together or couple to the inner saddle coil, thus resulting in a loss of sensitivity and an increase of complexity in tuning the individual coils. More irradiation frequencies are achieved by double or triple tuning the outer saddle coil. The process of double tuning decreases the efficiency of the coils, thereby requiring more drive power to cause the desired nuclear resonance transitions.

Accordingly, it can be appreciated that the related prior art does not provide a multifrequency tuned quadrature probe design for an RF probe which has high resolution and with capacity for multifrequency decoupling. Moreover, the art is lacking such a probe, which has excellent sensitivity and efficient RF power usage and simplicity in structure.

SUMMARY OF THE INVENTION

Accordingly, an object of the invention is to overcome the foregoing and other deficiencies and problems of the prior art.

Another object is to provide a novel RF probe structure which has mechanism for selectively controlling the resonant frequency of the detection coil of the RF probe.

A further object is to improve the reliability, power efficiency, and sensitivity of the RF probe used in NMR systems.

Another object is to provide a coil system, which has minimal mutual inductance.

A further object is to provide a probe, which has multiple frequency capabilities.

Another object is to provide an NMR probe, which has coils that irradiate different kinds of nuclei, wherein all of the coils are arranged to be mutually transparent and thus have minimal mutual inductance.

The foregoing and other objects are attained by the invention, which encompasses a unique and novel structure RF probe, for example, used in an NMR system, wherein a cylindrical birdcage coil is configured to have a capacitor toward one end portion thereof comprising a conductive ring disposed within or outside the birdcage, which is circumferentially or axially mutually movable to selectively control the frequency of the birdcage coil. The birdcage coil may be configured of a plurality of parallel straight legs, or tapered legs, extending from a conductive ring. The probe may also combine the birdcage with a spiral coil, which in operation is not inductively coupled to the birdcage coil. The birdcage coil and/or spiral coil may be cooled to a low temperature so as to increase the sensitivity and increase the power efficiency.

A feature of the invention is an NMR probe comprising a birdcage coil; a first cylinder having a first conductive ring fitted on an end portion thereof, wherein the first cylinder is fitted within or outside the birdcage coil, and wherein the first conductive ring and the birdcage coil form capacitance or inductance therebetween, and are mutually movable so as to selectively control the resonant frequency of the birdcage coil.

Another feature is the birdcage coil comprising a plurality of conductive parallel and axially extending legs attached to a conductive ring.

A further feature is the birdcage coil comprising a plurality of conductive tapered legs extending from a conductive ring.

Another feature of the birdcage coil is that it further comprises a second cylinder having fitted on an outer surface end portion a second conductive ring, with the first cylinder being fitted within the birdcage coil, and the second cylinder being fitted outside the birdcage coil, and wherein the first and second conductive rings and the birdcage coil are mutually movable therebetween so as to selectively control the resonant frequency of the birdcage coil.

Another feature is the first cylinder comprising a birdcage coil having a plurality of tapered or parallel legs extending from the conductive ring.

Another feature is a third conductive ring disposed on an end portion of the second cylinder fitted over the birdcage coil.

A further feature is a double 360° twisted decoupling coil disposed on the outside of the second cylinder.

Another feature is a detection coil comprising a ring end portion, and two or more pairs of coils extending therefrom.

Another feature is the detection coil being held set of sapphire rods with capacitors being connected to the detection coils.

Another feature is that the decoupling coils provide signals from at least one tuning circuit comprising a first capacitor parallely connected to a first inductor, and a second tuning circuit comprising serially connected second capacitor and second inductor, to form a double tuned circuit.

Another feature is the birdcage coil being supplied with a low temperature environment.

A further feature is the decoupling coil being supplied with a low temperature environment.

Another feature is an RF resonator system for irradiating and detecting nuclear magnetic resonance signals, wherein the system comprises an inner resonator for stimulation and detection of nuclear magnetic resonance signals from one nuclear species; and outer resonator for irradiation of resonance of at least one other nuclear species, wherein the outer resonator has the shape of a spirally wound coil which has substantially zero mutual coupling with the inner resonator.

A further feature is that the inner resonator is a birdcage coil.

A further feature is that the inner resonator is a Helmholz coil.

Another feature is that at least the inner resonator is subjected to a low temperature cooling.

Another feature is that the birdcage coil is made of super conducting material.

Another feature is that the inner resonator comprises a single saddle coil.

A further feature is that the inner resonator comprises a first and second saddle coil disposed at 90° with respect to each other so as to enable quadrature detection.

Further features are that the system further comprises a receiver and an RF output amplifier, and that the inner resonator is coupled to the receiver and the outer resonator is coupled to the RF output amplifier.

Another feature is that the inner resonator comprises a birdcage coil comprising at least a pair of conductive rings forming a capacitor, which are mutually movable axially or circumferentially to selectively control the resonant frequency of the inner resonator.

A further feature is an NMR system having means for irradiating and detecting nuclear magnetic resonance signals from a sample, and comprising an inner resonator for stimulation and detection of the nuclear magnetic resonance signal from at least one nuclear species, the inner resonator comprising a birdcage coil with a capacitor formed by a conductive ring and the birdcage coil, the capacitor being changeable by mutual movement of the ring and coil, to selectively control the resonant frequency of the inner resonator; at least one outer resonator for irradiation of resonance of at least one other nuclear species, the outer resonator having the shape of a spirally wound coil which has substantially zero mutual coupling to the inner resonator; and mechanism for cooling the birdcage coil of the first resonator.

Another feature is that the birdcage coil comprises a conductive ring and extend therefrom a plurality of parallel straight legs.

Another feature is that the birdcage coil comprises a conductor ring and a plurality of tapered legs therefrom.

Another feature is that the detection coil comprises a first and second coil in shape of saddles disposed at 90° with respect to each other to detect quadrature signals.

The foregoing and other features and objects are more specifically described together with preferred embodiments in the following drawings.

DETAILED DESCRIPTION OF THE PREFERRED EMBODIMENTS

Figure 1A:
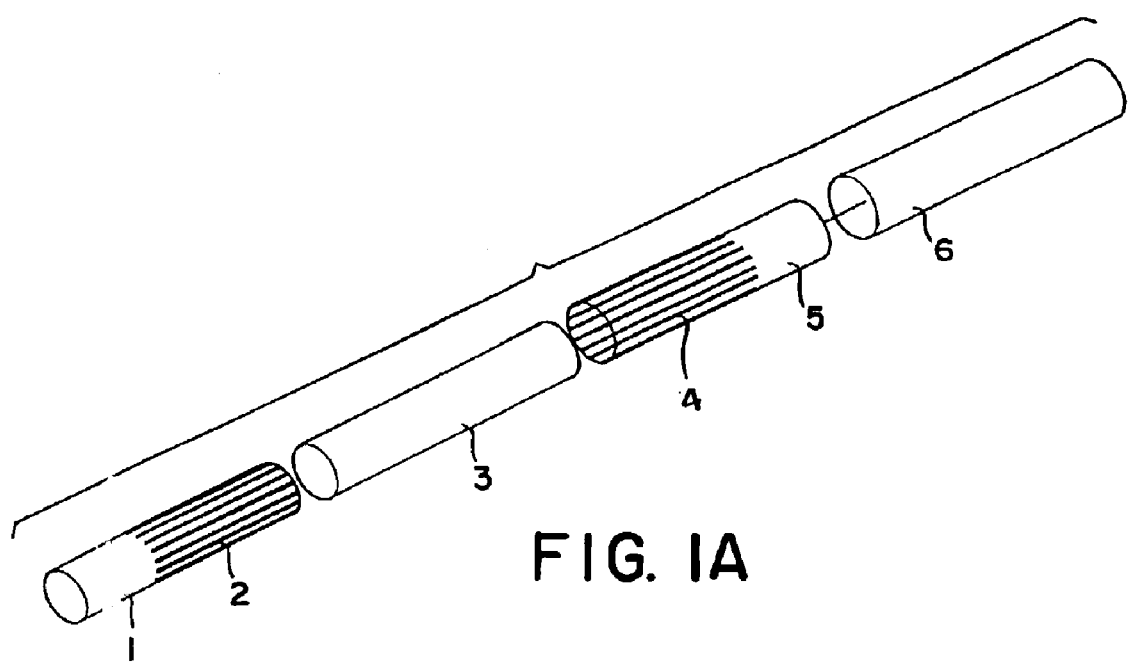
FIGS. 1A, 1B are an exploded view and an assembled view, respectively, of a low pass birdcage coil comprising a plurality of layers.
Figure 1B:
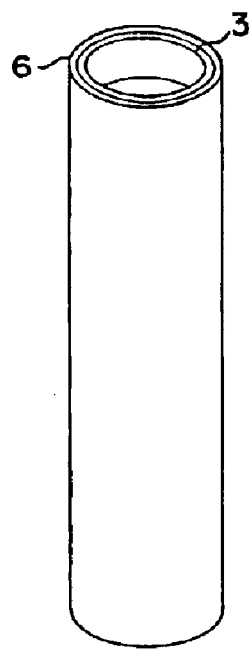

FIG. 1A shows an unassembled birdcage type coil and FIG. 1B shows the assembled coil, wherein an inner cylindrical conductive coil, comprising a conductive, e.g. metal, ring 1 and conductive, e.g. metal, parallely extending legs 2, is inserted within a cylindrical glass, or other non-conductive material, cylinder 3. On the other side, a similar cylindrical glass, or other non-conductive material, cylinder 6 is fitted over an outer cylindrical coil, comprising a conductive, e.g. metal, ring 5 and conductive, e.g. metal, parallely extending legs 4. The glass cylinder 3, having the inner cylindrical coil therein, is fitted within the outer cylindrical coil fitted within glass cylinder or tube 6. As so assembled, the resulting birdcage coil is shown in FIG. 1B.

Advantageously, the inner and outer coils and the component legs 2,4 and rings 1,5 are disposed to be overlapping so that a quadrature 1H detection coil results with capacitance and/or inductive loop coupling. The resonance frequency of the coil can be readily adjusted and selectively controlled by changing the overlapping therebetween by either mutual rotation about the common axis or by lateral axial movement therebetween.

The inner and outer coils, comprising at least the legs 2, 4 are made of a compensated metal foil having zero magnetic susceptibility. For example, the legs 2, 4 are made of copper and/or aluminum, and are typically 2 to 5 mils thick.

FIGS. 1A, 1B as well as the other figures in the drawing, omit the electrical connections for sake of clarity of description. However, various electrical connections would be apparent to the worker skilled in the art.

Figure 2A:
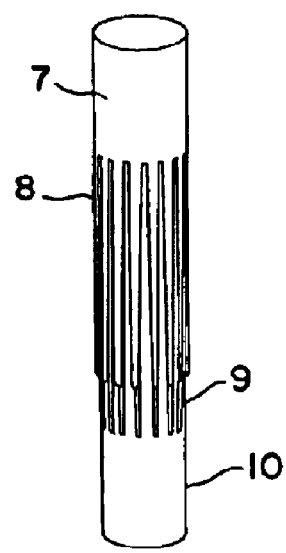
FIGS. 2A, 2B, 2C are similar to FIGS. 1A, 1B, except showing tapered legs.

FIG. 2A shows a birdcage coil similar to that of FIGS. 1A, 1B, omitting the glass interleavings for sake of clarity of description. The difference between these embodiments is in the legs 8, 9, which are tapered rather than being straight as shown by legs 2, 4 in FIGS. 1A, 1B. The conductive rings 7, 10 are similar to the conductive rings I, 5 of FIGS. 1A, 1B.

It was discovered that the tapered leg design 8, 9 provided an improved current distribution over the straight leg design 2,4 of FIGS. 1A, 1B.

Figure 2B:
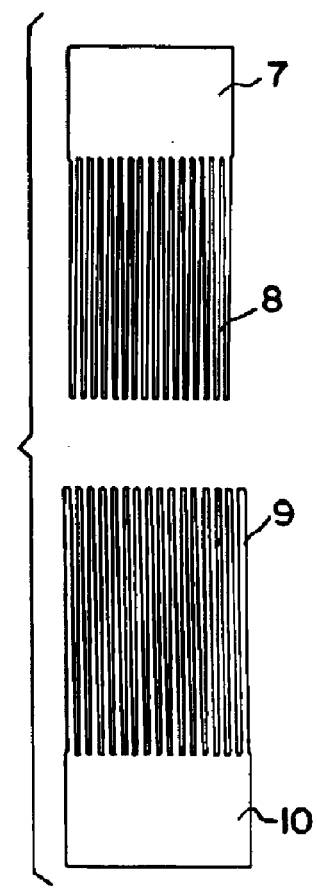
Figure 2C:
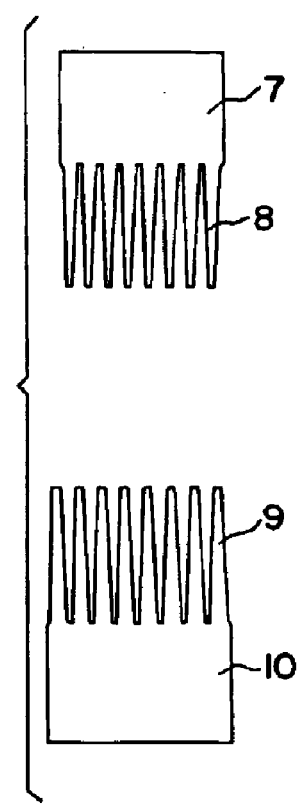

FIGS. 2B, 2C show similar tapered leg designs 8, 9 of FIG. 2A, with a difference therebetween being in the fineness of the tapered design. It should be noted that the arrangement of the extended legs 8,9 (of FIGS. 2A, 2B, 2C) and the extended legs 2,4 (of FIGS. 1A, 1B) can be positioned with the legs overlapping each other as in FIGS. 1A, and 2A, or with the conductive rings 7, 10 overlapping each other. In both of these cases, there is still the overlapping of the rings forming the capacitor and the legs forming the inductors which can be axially or circumferentially moved to selectively control the frequency of the coils. In FIG. 2A, the two tapered legs form a cylindrical shape structure with metal more uniformly distributed over the entire coil. This arrangement shows less perturbation to the polarizing magnetic field $B_o$. In other words, the embodiment of FIG. 2A provides uniform distribution of metal, and the $B_o$ magnetic field perturbation caused susceptibility is minimized.

Figure 3A:
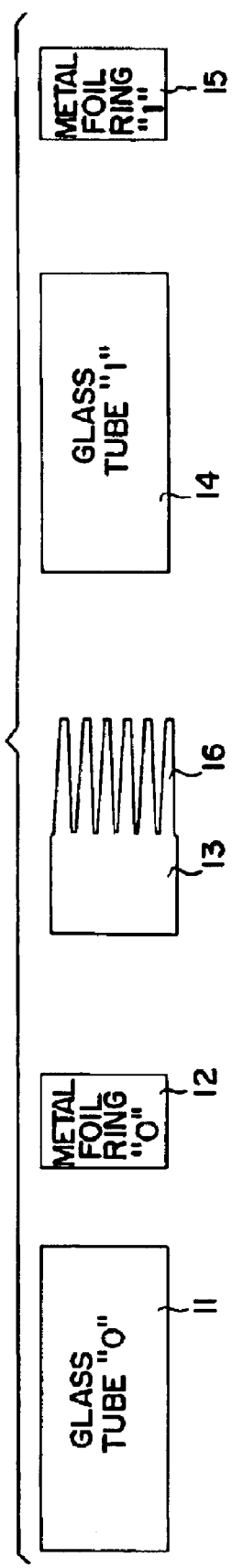
FIGS. 3A, 3B, 3C are unassembled views (3A, 3B) and assembled view (3C) of a low pass birdcage coil with a plurality of tapered legs with inside and outside glass tubes and rings.
Figure 3B:
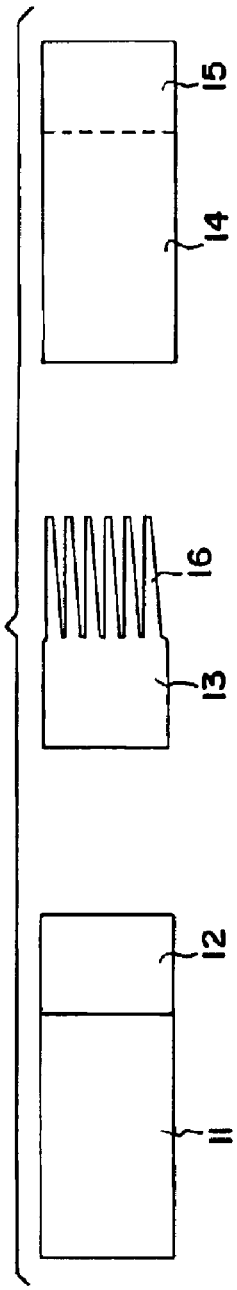
Figure 3C:
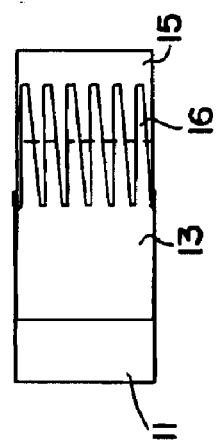

FIGS. 3A, 3B, 3C show an assemblying of another birdcage coil using a single tapered leg arrangement, wherein in FIG. 3A an inner "i" glass, or other non-conductive material, tube or cylinder 14 has an inner "i" metal foil, or other conductive material, ring 15 placed inside the inner surface thereof. The cylindrical birdcage coil comprising ring 13 and tapered legs 16 is then placed outside the inner glass tube 14 having ring 15. The outer "0" glass tube 11, having etal foil ring 12 thereon is placed surrounding the conductive ring 15 with conductive ring 13 and conductive legs 16 being in overlapping positions, as shown in FIG. 3C. In this manner, similar to the coil of FIGS. 1A, 1B, the resonance frequency can be selectively controlled by the selective axial movement of the rings and/or legs, vis-a-vis each other. Moreover, as depicted in FIG. 3C, there are two sets of capacitors, first between inner ring 15 and coil ring 13 (or legs 16) and the second between outer ring 12 and coil ring 13 (or legs 16). Advantageously, the inner ring capacitor may be used to define the radio frequency window, and the outer ring capacitor may be used to selectively adjust and control the resonant frequency of the coil.

In FIGS. 3A, 3B, 3C, it is also possible to place ring 15 exterior to tube 14, and ring 12 inside tube 11 with the coil ring 13 and legs 16 being outside tube 14, or in any other combination of placement of the rings, coils and glass tubes, as desired. In such embodiments, the axial movement of the rings and other parts, enables setting of the radio frequency window and selective control of the resonant frequency.

Figure 4A:
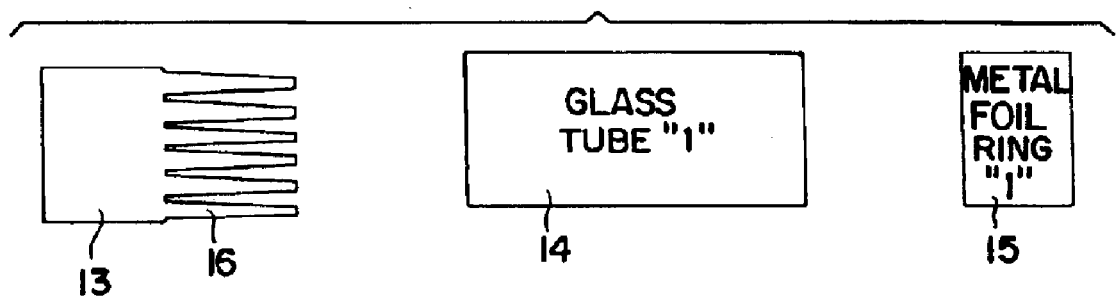
FIGS. 4A, 4B, 4C are the same as FIGS. 3A, 3B, 3C, except that the outer "0" glass tube and the outer "0" metal foil ring are missing.
Figure 4B:
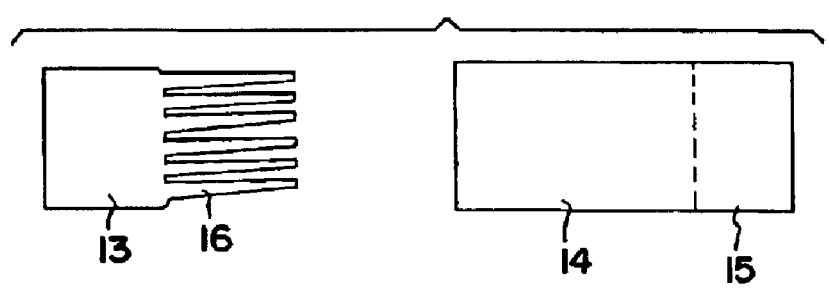
Figure 4C:
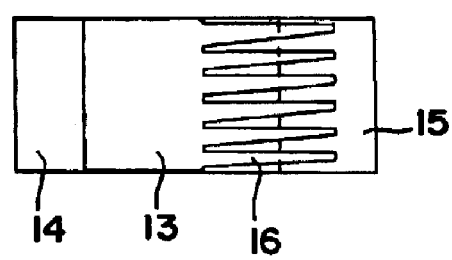

FIGS. 4A, 4B, 4C are similar to FIGS. 3A, 3B, 3C, except that the outer "0" glass tube 11, and outer "0" metal foil ring 12 are not used. Thus, there is only a single capacitor between ring 15 and ring 13 (or legs 16). The selective axial movement of rings 15 and rings 13 and legs 16 provide selective adjustment and control of the resonant frequency.

Figure 5A:
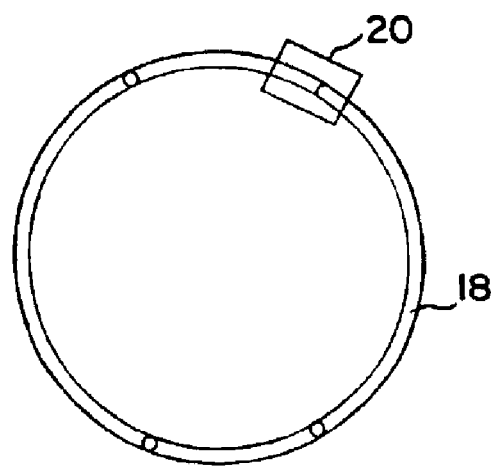
FIGS. 5A, 5B are a top view and a front view, respectively, of a cylindrical symmetric decoupling coil.
Figure 5B:
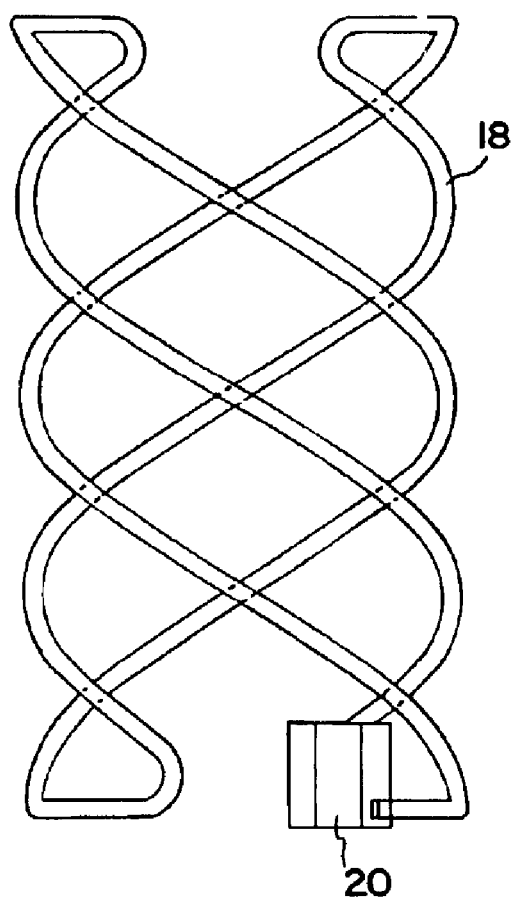

FIG. 5A shows a top view and FIG. 5B shows a pictorial side view of a spiral saddle decoupling coil pair 18. The coil pair 18 are spiral shaped and form a 360° circle as viewed from the top and are 180° separate from each other. The decoupling coil is used for single, double, or broad band tuning.

Figure 6:
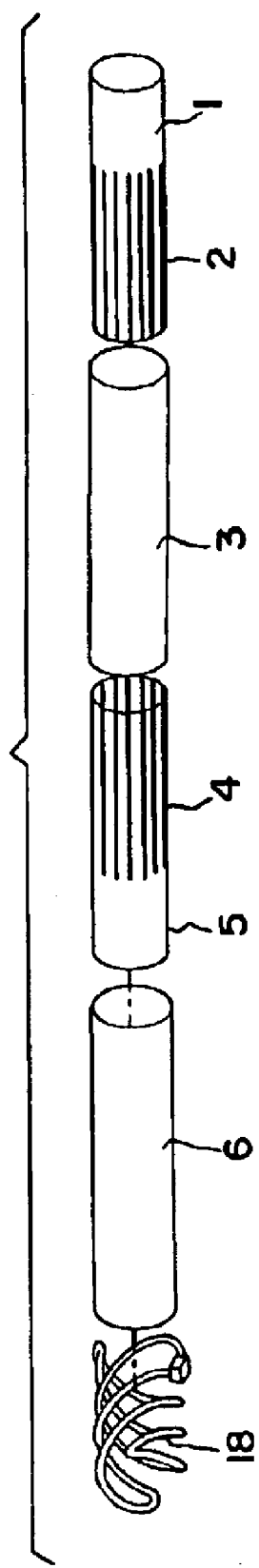
FIG. 6 is a pictorial view depicting an unassembled coil of FIGS. 1A, 1B together with the coil of FIG. 5B disposed as an outside layer.

FIG. 6 shows a birdcage coil and glass tube configuration, such as shown in FIGS. 1A, 1B, with a spiral saddle decoupling coil, such as shown in FIGS. 5A, 5B, arranged surrounding the outer surface of outer glass tube 6 so that the decoupling coils 18 are inductively decoupled birdcage configuration.

As thus configured, the birdcage and decoupling configuration of FIG. 6, optimizes wiring spacing for good $B_1$ field homogeneity along a Z axis. Advantageously, the coils may be made of compensated foils and/or wires. The configuration comprises a multiple isolated coil set.

Figure 9:
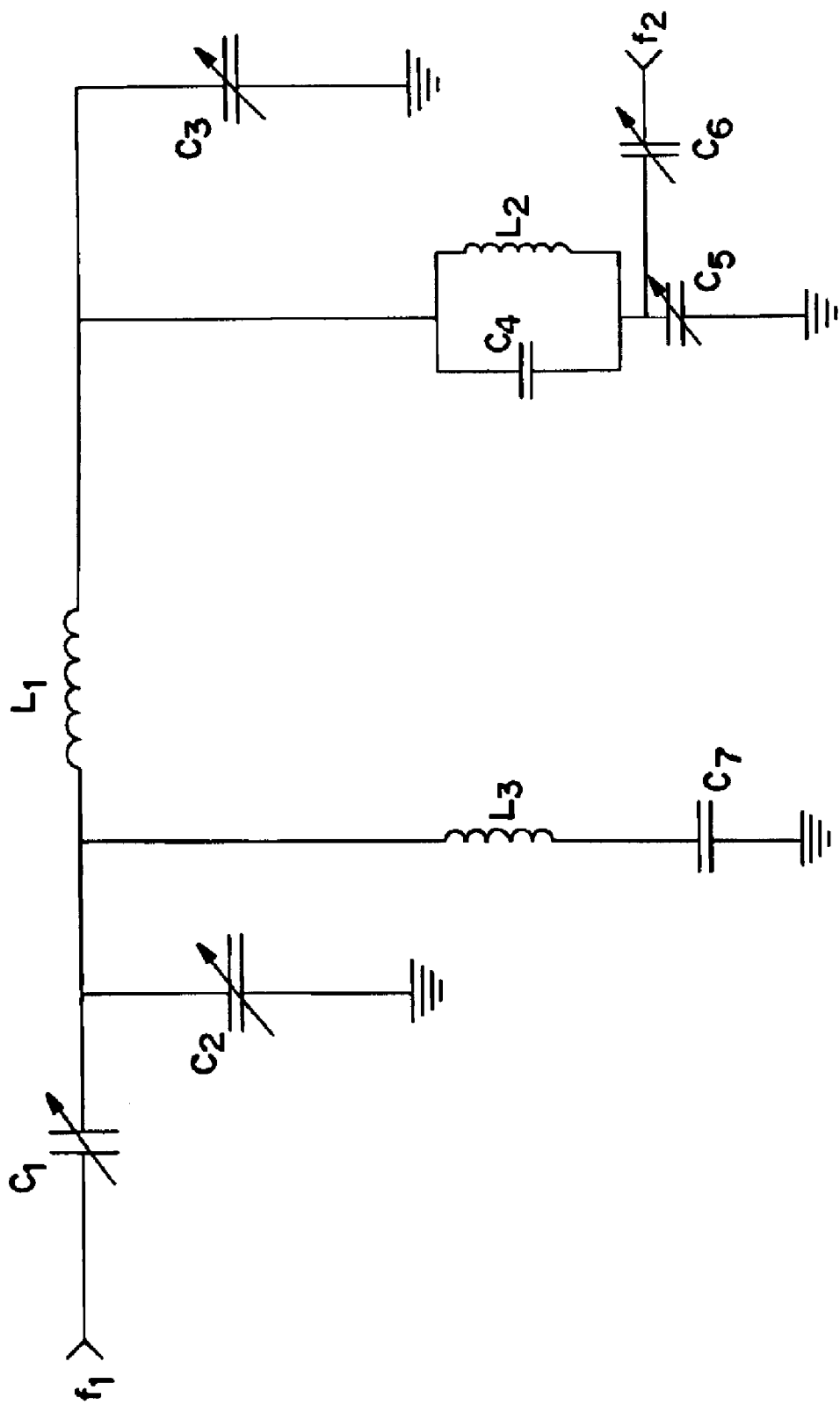
FIG. 9 is a circuit diagram depicting a regular double tuned signal source of the spiral decoupling coil of FIGS. 5A, 5B.

FIG. 9 depicts a typical circuit of a regular double tuned method with a spiral decoupling coil $L_1$ such as shown in FIGS. 5A, 5B. The circuit comprises capacitors $C_1$, $C_2$, $C_3$, $C_4$, $C_5$, $C_6$ and $C_7$; and inductors $L_1$, $L_2$, and $L_3$. Capacitor $C_1$ receives signal $f_1$. Capacitors $C_2$ and $C_3$ are tuned to input signal frequency $f_1$, which may be the resonant frequency of an irradiated isotope. Inductor $L_1$ is the spiral decoupling coil of the invention. $C_4$ and $L_2$ form a parallel resonant circuit. Capacitor $C_5$ is tuned to frequency $f_2$, which may be the frequency of a second irradiated isotope, with capacitor $C_6$ being a matching capacitor of frequency $f_2$ the second irradiated isotope.

The double tuned circuit of FIG. 9 may be used to provide to decoupling frequencies.

The configuration of FIG. 6 can be used to form an indirect detection (ID) probe as will be discussed later. The birdcage coil and the spiral decoupling coil are mutually transparent in this arrangement.

An alternative arrangement can be the use of the birdcage coil with two or more spiral decoupling coils.

Figure 7:
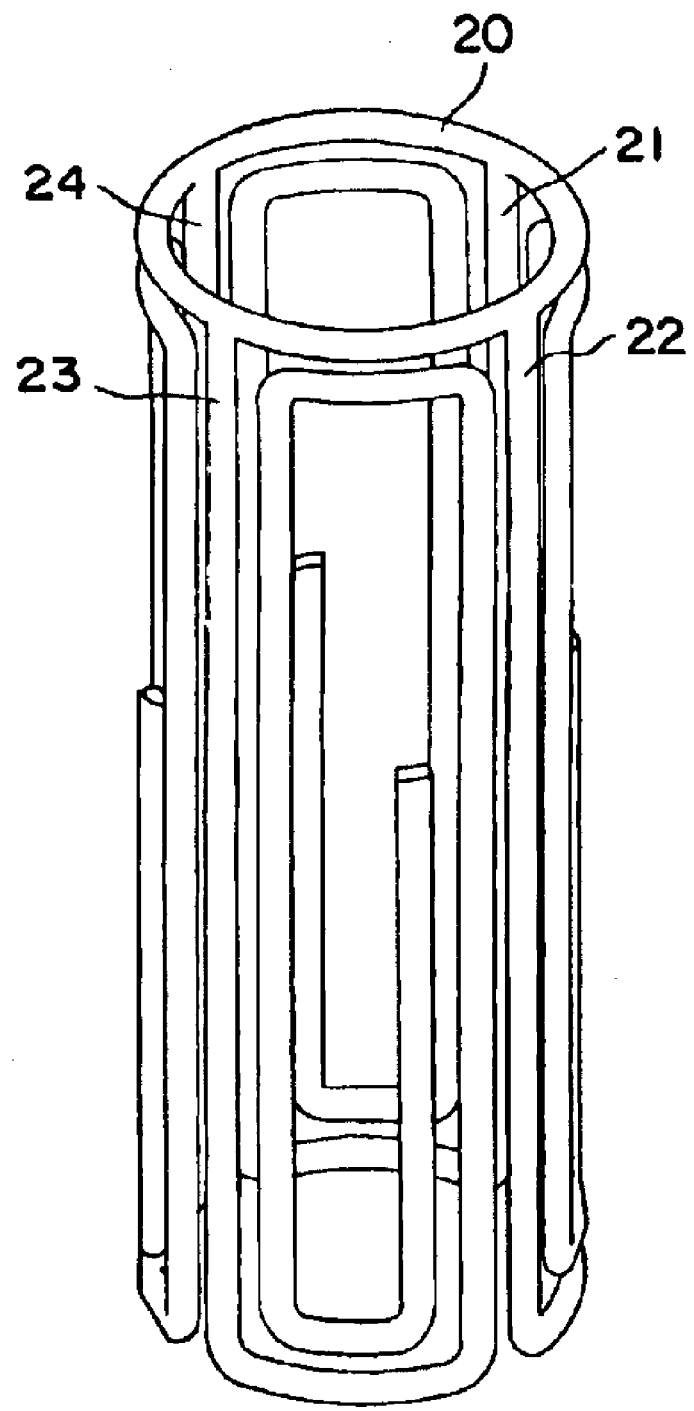
FIG. 7 is a pictorial view depicting a detection coil with a four fold design.

FIG. 7 depicts another detection coil incorporating two saddle coils oriented at right angles with respect to each other. One saddle coil comprises coils 21 and 23, and the other saddle coil comprises coils 22 and 24. The coils are connected to ring 20.

Figure 8A:
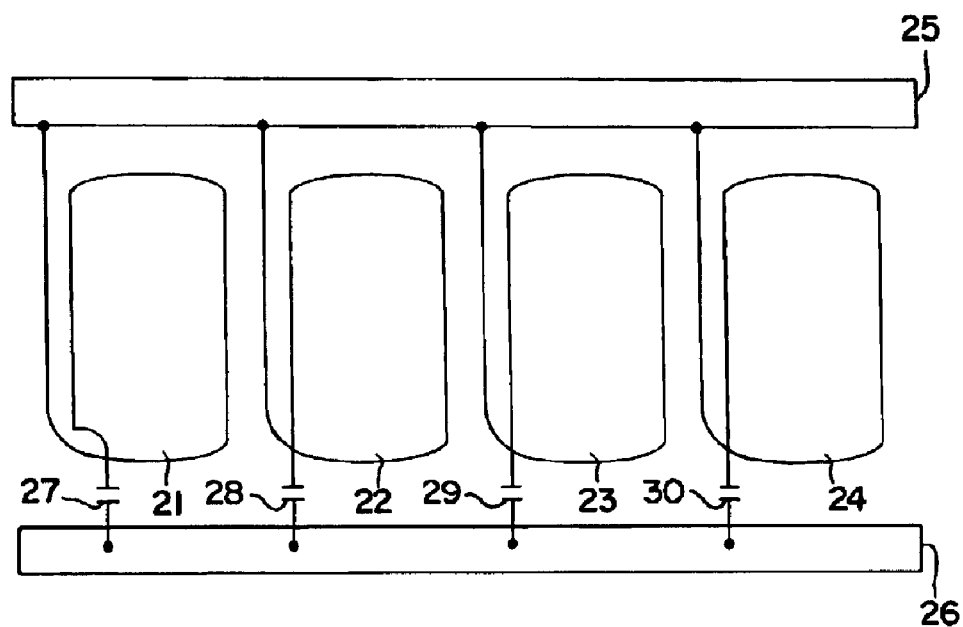
FIGS. 8A, 8B are a side view (8A) depicting representationally the detection coil of FIG. 7 and a side view (8B) of a structure using a cylindrical tube and supported by sapphire columns.

A representational view of the coil of FIG. 7 is shown in FIG. 8A, comprising the upper common conductor 25, and multiple coils 21, 22, 23, 24 and lower terminal 26 with capacitors 27, 28, 29, 30 connected to the ends of the multiple coils, respectively. The capacitors may be formed, as shown in the prior embodiments, by conductive rings. The terminals, which are shown connected to the capacitors, may be inductively or capacitively or directly accessed with appropriate signals. The common conductor 25 may serve as common ground.

Figure 8B:
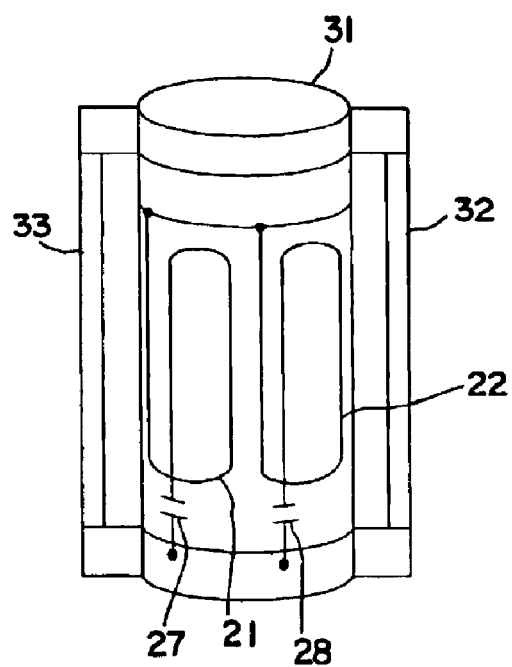

A physical structure of FIG. 7 is representationally shown in FIG. 8B, wherein the coils or multiple windings 21, 22, 23, 24 and capacitors 27, 28, 29, 30 are built on a glass tube 31 and supported by a plurality of sapphire rods 32. The tube 31 may be of other suitable non-conductive material. Also, the sapphire rods 32, 33 may be of other suitable material. Advantageously, this structure of FIG. 8B, using the sapphire rods 32, 33 enable convenient laying interconnection and access of the coils.

The detection coils of FIGS. 7, 8A, 8B have four coils and may be used in place of the detection coils of FIGS. 1, 2 and 3, for example, in the combined coil structure of FIG. 6 in place of the birdcage coil with appropriate frequency tuning controlled in the manner discussed.

Advantageously, the coils of the invention have structures which are made of compensated wire, foil and slip glass tubes, for example. Thus, the coils of the invention are especially advantageous for use in high resolution NMR detectors. Also, the invention includes a quadrature detector birdcage coil combined with a broad band decoupling coil. Thus, the invention enables quadrature detection and multiple frequency decoupling. Also, the spiral shaped decoupling saddle coil is inductively transparent to the regular saddle coil and quadrature coil. It can also be multiple frequency tuned through the disclosed circuit. Also, the invention has a structure, which is convenient, flexible, inexpensive, and efficient in design.

The above described coils, which may also be referred to as resonators, may be of a material which is superconductive, or subjected to cooling, or one which has low magnetic susceptibility or high conductivity at low temperatures. For example, the invention may incorporate a cryogenic cooled detector coil, such as inner coil, labeled 1–6 of FIG. 6, that provides high sensitivity and outer coil 18 that is mutual transparent, i.e. have negligible mutual inductance with the inner coil. The cooling environment may be supplied to either the inner coil and/or outer coil as desired. The outer coil may be of ordinary material when not subjected to low temperature cooling.

Sensitivity is an important factor in high resolution NMR spectroscopy. Higher sensitivity permits use of smaller amounts of sample material, which is an important factor in various matters. The use of quadrature pickup or detection coils provides improvement in sensitivity. By cooling the detection coils, a further improvement in increased sensitivity, such as by a factor of 3, is obtained. The use of multiple frequencies is also important to solving complex molecular structures that contain certain types of nuclei. Spiral wound coil 18 of FIG. 6 that surrounds inner detection coils provide multiple frequency capabilities. The high sensitivity of the detection coil is not compromised because of the small mutual coupling to the spiral coils. Cooling the coils will provide a greater RF field strength for a given amount of driving power, in addition to the increase in sensitivity.

Figure 10:
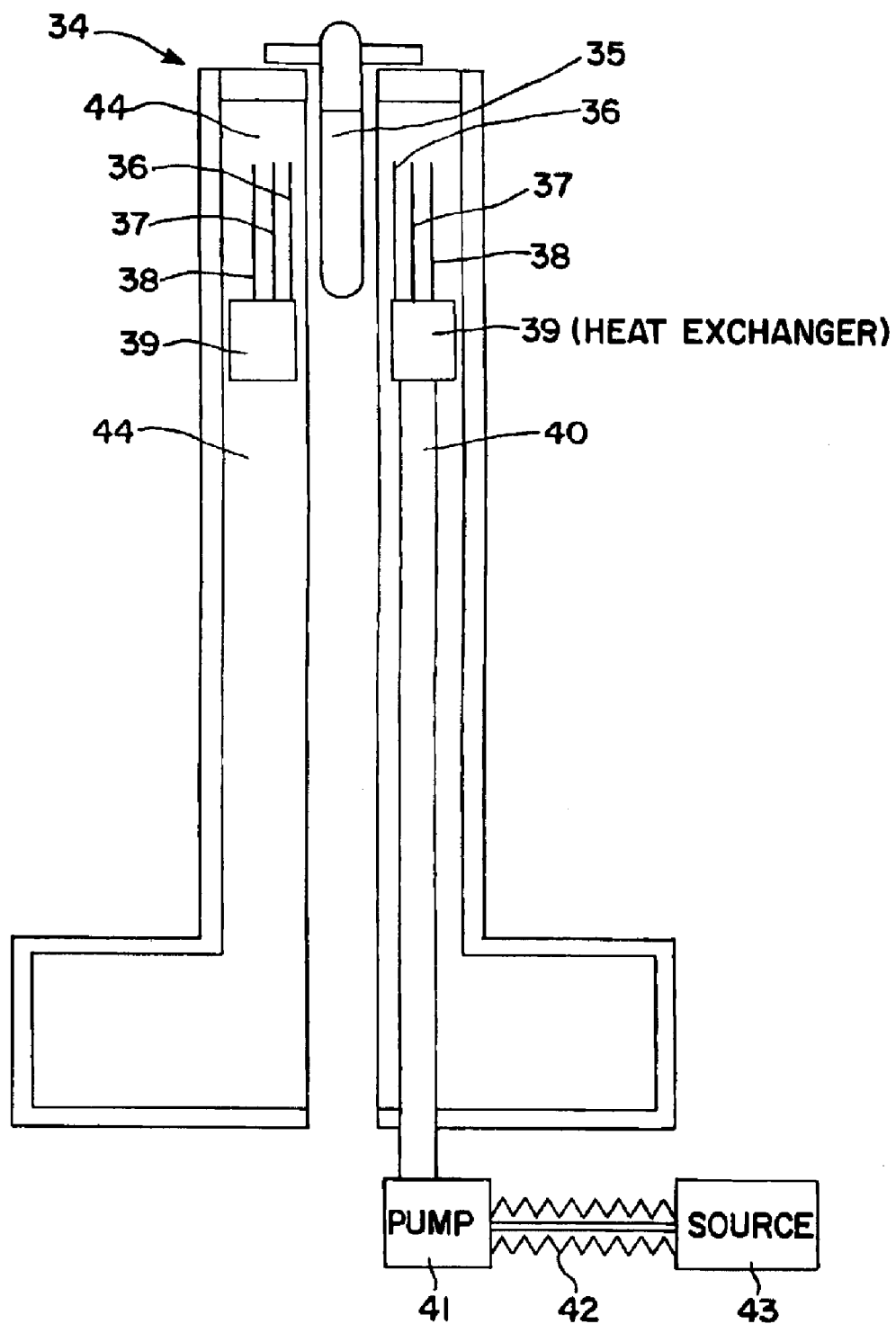
FIG. 10 is a block diagram depicting an NMR probe using cryogenic cooled quadrature detection coil and spiral decoupling coils.

FIG. 10 is a cross sectional view depicting a cryogenic cooled NMR probe 34 comprising three sets of resonators 36, 37, 38 to enable RF fields to be applied to the sample 35. The resonators are mechanically supported and thermally coupled to thermal block or heat exchanger 39. Cryogenic fluid, such as cold liquid or gas, is stored in Dewar or refrigerated source 43, and pumped by pump 41, through flexible bellows 42, and through tube 40, to thermal block 39. To thermally isolate the coils, the internal region 44 is evacuated.

Figure 11:
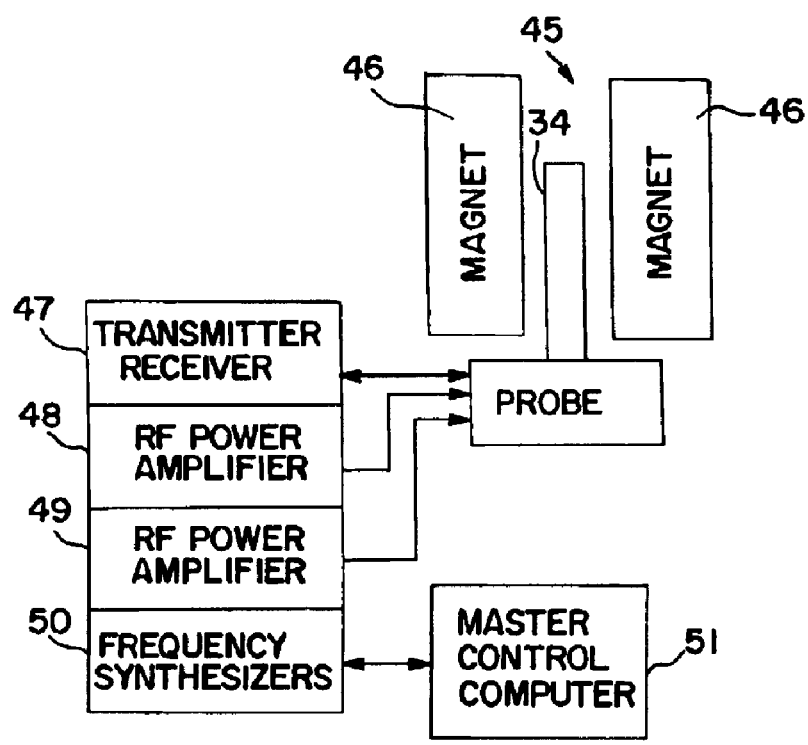
FIG. 11 is a block diagram depicting an NMR system using the invention probe.

FIG. 11 depicts a block diagram of an NMR system having, for example, the probe 34 of FIG. 10. The probe 34 is inserted into the bore of a superconductive magnet 46. Other types of magnets can also be used. The system is controlled by a master control computer 51. Frequency synthesizer 50 generates frequencies for transmitter and receiver 47 and power amplifiers 48, 49. The transmitter and receiver 47 is coupled to resonator 36 of FIG. 10 and is used to detect NMR signals. RF power amplifiers 48, 49 are used to stimulate nuclear transitions and are coupled to resonators 37, 38 of FIG. 10.

The inner resonator 36 of FIG. 10 may be a birdcage coil, such as shown in FIGS. 1–4 and be made of copper and/or aluminum that is thermally anchored to a dielectric support, such rods. The sapphire support may be thermally coupled to a heat exchanger or thermal block 39 in FIG. 10, causing it to be cooled. Typical operating temperatures for the coils may be in the range of below 30 K. At these temperatures, the sensitivity increases because the Q of increases thereby increasing the signal strength, and the thermal noise generated by the coils decreases.

Figure 12:
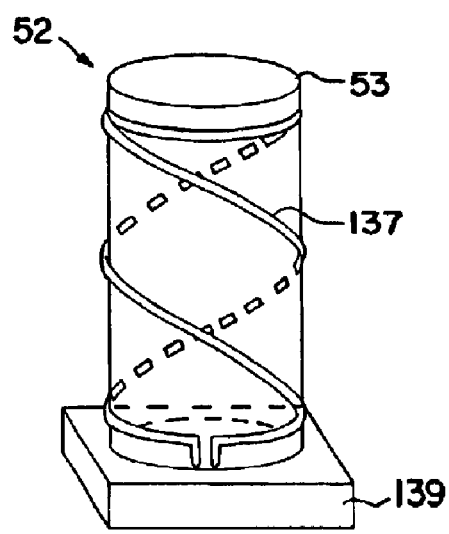
FIG. 12 is a pictorial view depicting a spiral wound single turn coil.

The outer resonators 37,38 of FIG. 10 may be a spiral wound coil, such as shown in FIGS. 7, 8, 12 and 13. FIG. 12 shows an example of a single turn spiral wound resonator 52. The spiral wound coil 137 has a twisted angle, which is 360° clockwise as seen from the top thereof. The RF fields produced by such spiral coils have both positive and negative components that traverse the inner resonator 36 thereby largely canceling the mutual inductance between the coils. Coil 137 may be in the form of a wire or foil fixed to a dielectric cylinder 53, which may be made of sapphire. Dielectric cylinder 53, which may also be of glass or other non-conductive material, is attached to heat exchanger 139. Coil 137 may be used in the resonator 37, 38 of FIG. 10.

Figure 13:
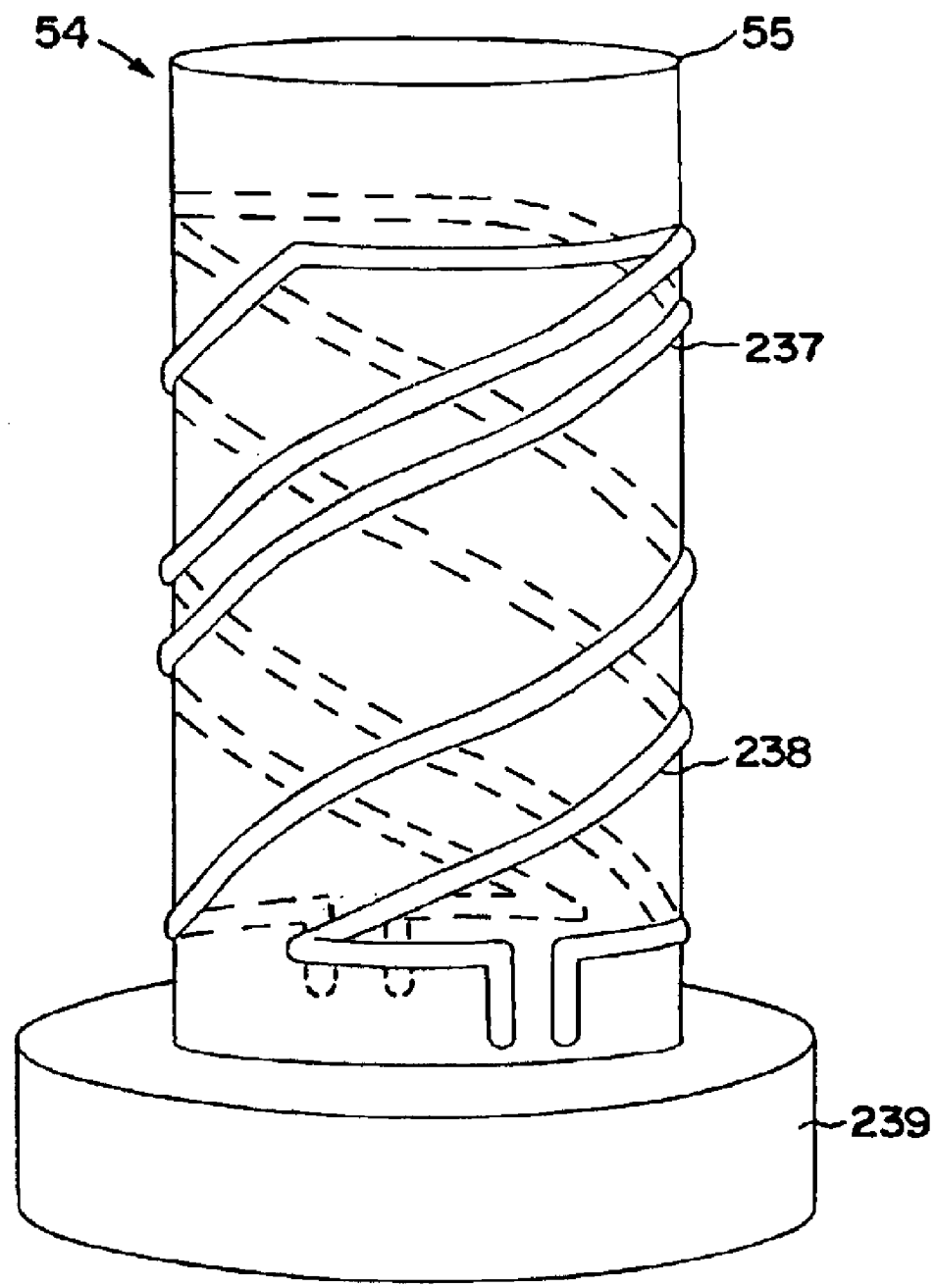
FIG. 13 is a pictorial view depicting spiral wound saddle pair coils.
Figure 14:
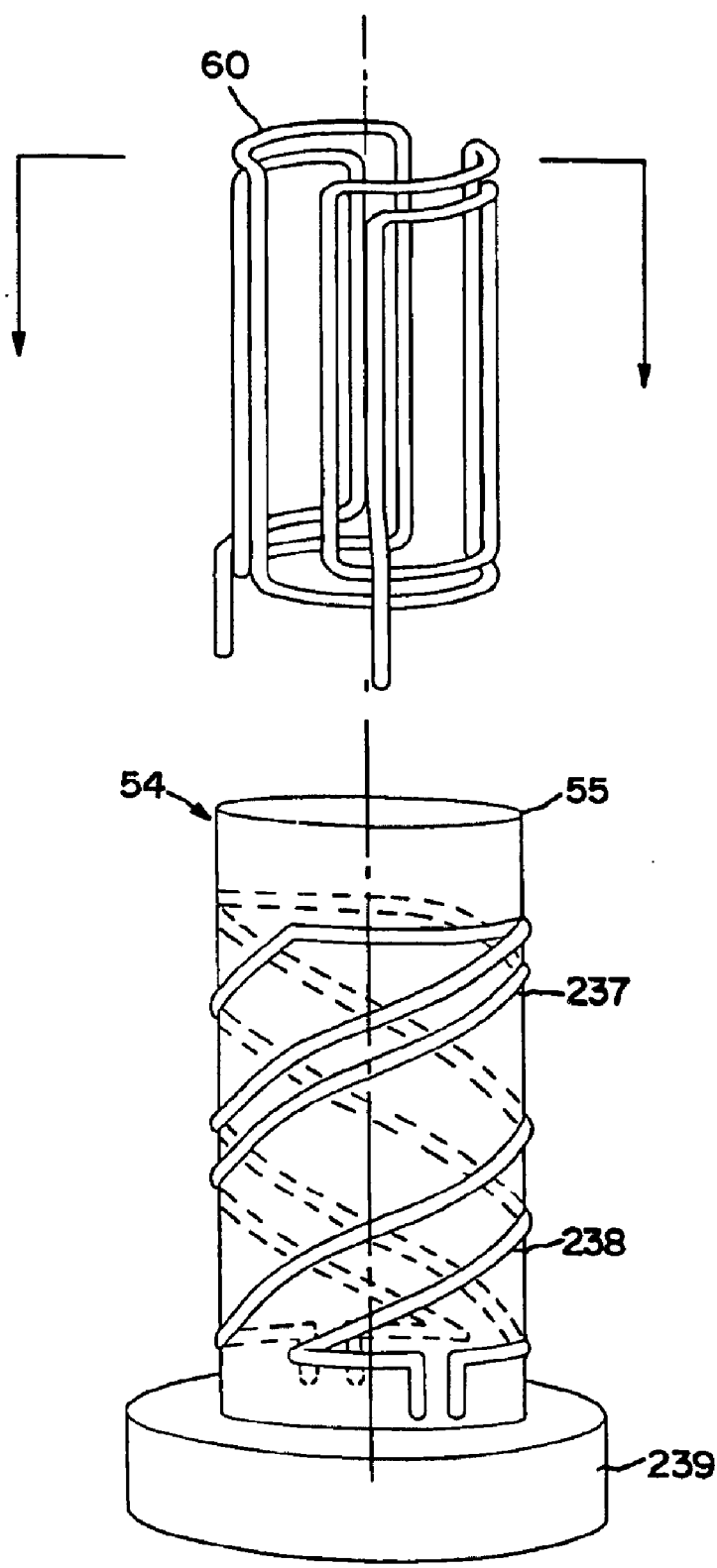
FIG. 14 is an exploded perspective view of a resonator and a single saddle coil 60.
Figure 15:
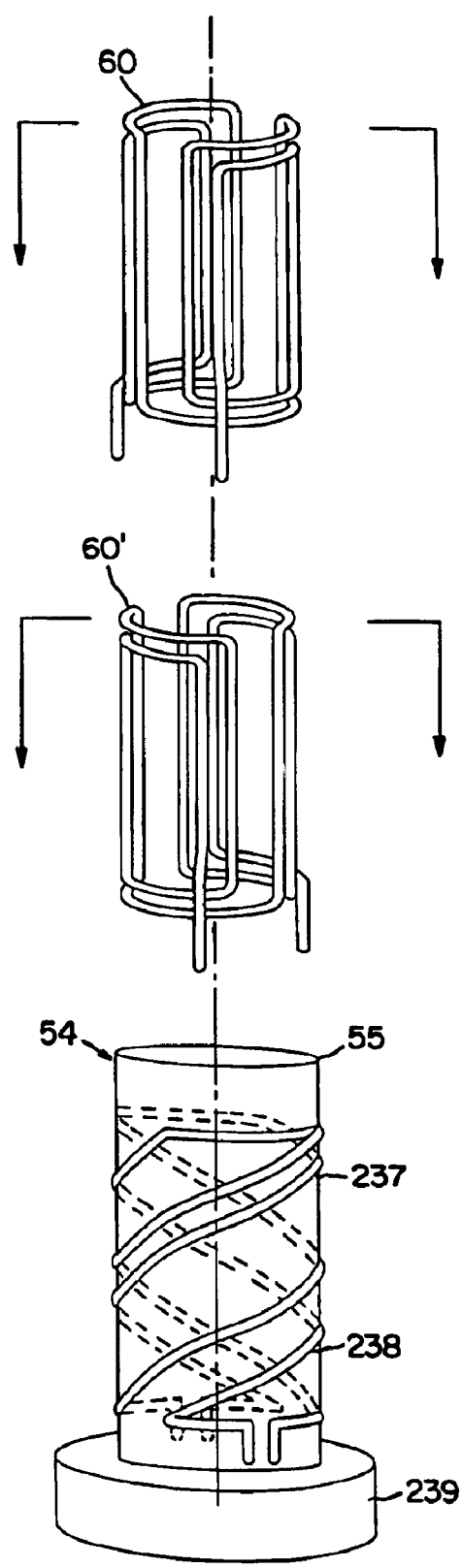
FIG. 15 is an exploded perspective view of a resonator and a pair of saddle coils 60 and 60' that are disposed at 90° from each other.

FIG. 13 is an example of a spiral wound saddle coil 54, wherein each coil 237 and 238 form a coil pair called a saddle coil. The spacing of the two turns is adjusted to optimize the homogeneity of the RF field produced by the coil over region of the sample. The two coils 237, 238 may either be connected in series or in parallel. A parallel connection is preferred at frequencies of several hundred megahertz or above that minimizes the total inductance. As with the single turn coil, each turn has a twist angle of 360°. The two turns may be wound either in a clockwise direction, as shown in FIG. 13, or counterclockwise direction. The saddle coil 54 may be used as resonators 37 and 38 of FIG. 10.

In one embodiment, resonator 37 of FIG. 10 is wound in a clockwise direction and resonator 38 is wound in a counter-clockwise direction. In another embodiment, coil 37 is either a one or two turn spiral wound coil, and resonator 38 is a similar resonator, but rotated by 90°. In either of these embodiments, resonators 37, 38 have minimum mutual couplings to each other and also to the resonator 36.

In the foregoing embodiments, the total twist the resonator coils are plus and minus 360°. Other coil combinations of twist angles may be used and still achieve minimum mutual inductance between the coils. By making the twist angles of these coils differ by multiples of 360°, minimum inductance between the resonators or coils is achieved.

Resonators 37, 38 of FIG. 10 have spiral coils with one or two turns. At frequencies of 100 MHz and below, spiral coils with more turns may be used. Resonators with more turns have the advantage of larger inductance, and hence, may be tuned to lower frequencies with minimum of added capacitance.

In a further embodiment, the birdcage coils of FIGS. 1–3 may be used as detection resonator 36 of FIG. 10. For the best sensitivity, the coils are operated in a quadrature mode.

The foregoing description is illustrative of the principles of the invention. Numerous extensions and modifications thereof would be apparent to the worker skilled in the art. All such extensions and modifications are to be considered to be within the spirit and scope of this invention.

What is claimed is:
1. An NMR probe comprising:
a birdcage coil composed of susceptibility compensated material and comprising:
a non-conductive first cylinder;
a first conductive ring disposed inside said first conductive cylinder fitted on an end portion thereof;

a second conductive ring fitted external to said first non-conductive cylinder, wherein said first and second conductive rings and said non-conductive first cylinder form capacitance or inductance therebetween, and are mutually movable so as to selectively control a resonant frequency of said birdcage coil.

2. The NMR probe of claim 1, wherein said birdcage coil comprises a plurality of conductive parallel and axially extending legs connected to said first or second conductive ring.

3. The NMR probe of claim 1, wherein said birdcage coil comprises a plurality of conductive tapered legs extending from a said first or second conductive ring.

4. The NMR probe of claim 1, further comprising a third conductive ring with a second non-conductive cylinder having fitted on an inside surface end portion thereof, said second non-conductive cylinder being fitted between said third and second conductive rings, wherein said second and third conductive rings and said first conductive ring are mutually movable therebetween so as to selectively control resonant frequency of said birdcage coil.

5. The NMR probe of claim 1, wherein said first cylinder comprises a birdcage coil having a plurality of tapered or parallel straight legs extending from said conductive ring.

6. The NMR probe of claim 4, further comprising at least one twisted saddle decoupling coil disposed on the outside surface of said second cylinder, which has inconsiderable mutual coupling to said birdcage coil.

7. The NMR probe of claim 1, wherein said first non-conductive cylinder further comprising a ring end portion and extending from said ring end portion two pairs of coils extending axially therefrom.

8. The NMR probe of claim 7, wherein said two pairs of coils are held by at least a pair of sapphire rods, and each coil of said two pairs of coils comprises at least one capacitance.

9. The NMR probe of claim 6, wherein said at least one decoupling coil is provided with signals from a first tuning circuit comprising a first capacitor connected in parallel to a first inductor and a second tuning circuit comprising a second capacitor serially connected to a second inductor, thereby to form a double tuned circuit.

10. The NMR probe of claim 1, wherein said birdcage coil is supplied with a low temperature environment.

11. The NMR probe of claim 6, wherein said at least one twisted saddle decoupling coil is subjected to low temperature environment.

12. The NMR probe of claim 7, wherein said two pairs of coils are subjected to a low temperature environment.

13. An RF resonator system, which irradiates and detects nuclear magnetic resonance signals, said system comprising:

an inner resonator composed of susceptibility compensated material which stimulate and detect said nuclear magnetic resonance signals from one nuclear species; and at least one outer resonator composed of susceptibility compensated material, which irradiates of resonance of at least one other nuclear speciels, said outer resonator having the shape of one or more turn spiral wound coil which has substantially zero mutual coupling to said inner resonator.

14. The RF resonator system of claim 13, wherein said inner resonator comprises a birdcage coil.

15. The RF resonator system of claim 13, wherein said inner resonator comprises a Helmholz coil.

16. The RF resonator system of claim 13, wherein said inner resonator comprises a single saddle coil.

17. The RF resonator system of claim 13, wherein said inner resonator comprises a first saddle coil and a second saddle coil arranged at 90° angle from said first saddle coil so as to enable quadrature detection.

18. The RF resonator system of claim 13, further comprising a receiver and wherein said inner resonator is inductively coupled to said receiver.

19. The RF resonator system of claim 13, further output amplifier, and wherein said spiral wound coil is inductively coupled to said RF output amplifier.

20. The RF resonator system of claim 13, wherein said inner resonator comprises a birdcage coil including at least a pair of conductive rings forming a capacitor and which is axially or circumferentially movable to selectively control resonant frequency of said birdcage coil.

21. The RF resonator system of claim 13, further comprising:

means for cryogenically cooling at least said inner resonator.

22. The RF resonator system of claim 21, wherein said inner resonator is made of a superconductive material.

23. An NMR system, which irradiates and detects nuclear magnetic resonance signals from a sample, said system comprising:

a resonator composed of susceptibility compensated material, which simulates and detects said nuclear magnetic resonance signal from at least one nuclear species, said resonator comprising a birdcage coil and conductive ring disposed inside or outside of said birdcage coil, said resonator having a capacitance formed by said conductive ring and said birdcage coil, said capacitance being changeable by mutual movement of said conductive ring and said birdcage coil to selectively control resonant frequency of said resonator; and means for cooling at least said birdcage coil of said resonator.

24. The NMR system of claim 23, wherein said birdcage coil comprises a conductive ring and extending therefrom a plurality of parallel straight legs.

25. The NMR system of claim 23, wherein said birdcage coil comprises a plurality of conductive tapered legs extending from said conductive ring.

* * * * *